(12) United States Patent
Zhou et al.

(10) Patent No.: US 8,808,010 B2
(45) Date of Patent: Aug. 19, 2014

(54) INSULATED METAL SOCKET

(75) Inventors: Jiachun Zhou, Gilbert, AZ (US);
Dexian Liu, Jiangsu (CN); Siang Soh,
Milpitas, CA (US); Brian Hahn, Gilbert,
AZ (US); Bizhao Li, Jiangsu (CN)

(73) Assignee: Interconnect Devices, Inc., Kansas City, KS (US)

( * ) Notice: Subject to any disclaimer, the term of this patent is extended or adjusted under 35 U.S.C. 154(b) by 123 days.

(21) Appl. No.: 13/488,025

(22) Filed: Jun. 4, 2012

(65) Prior Publication Data

US 2012/0315775 A1 Dec. 13, 2012

Related U.S. Application Data

(60) Provisional application No. 61/493,720, filed on Jun. 6, 2011.

(51) Int. Cl.
*H01R 12/00* (2006.01)

(52) U.S. Cl.
USPC ............................................................ 439/66

(58) Field of Classification Search
USPC ........................................ 439/66, 91, 591, 83
See application file for complete search history.

(56) References Cited

U.S. PATENT DOCUMENTS

| | | | | |
|---|---|---|---|---|
| 4,961,709 | A * | 10/1990 | Noschese | 439/66 |
| 5,215,472 | A * | 6/1993 | DelPrete et al. | 439/71 |
| 5,230,632 | A * | 7/1993 | Baumberger et al. | 439/66 |
| 5,718,606 | A * | 2/1998 | Rigby et al. | 439/607.1 |
| 6,758,682 | B1 * | 7/2004 | Kosmala | 439/66 |
| 7,154,286 | B1 * | 12/2006 | Marx et al. | 324/755.05 |
| 7,470,149 | B2 * | 12/2008 | Kazama et al. | 439/607.05 |
| 7,833,023 | B2 * | 11/2010 | Di Stefano | 439/73 |
| 8,506,307 | B2 * | 8/2013 | Henry et al. | 439/66 |
| 2008/0100325 | A1 * | 5/2008 | Sinclair | 324/761 |
| 2008/0257200 | A1 * | 10/2008 | Minevski et al. | 106/1.18 |

FOREIGN PATENT DOCUMENTS

| | | |
|---|---|---|
| EP | 1 113 274 A1 | 7/2001 |
| JP | 2009-216501 A | 9/2009 |

OTHER PUBLICATIONS

International Search Report and Written Opinion issued in PCT International Application No. PCT/US2012/040880, mailed Sep. 4, 2012 (12 pages total).

* cited by examiner

*Primary Examiner* — Neil Abrams
*Assistant Examiner* — Phuongchi T Nguyen
(74) *Attorney, Agent, or Firm* — Finnegan, Henderson, Farabow, Garrett & Dunner LLP

(57) ABSTRACT

A socket for use in a test system is provided, where the test system is configured to align at least a portion of an electronic device with a plurality of aligned connectors. The socket can include a metal structure having a plurality of openings, the plurality of openings spaced to accommodate the plurality of aligned connectors. At least one opening in the plurality of openings can extend through a thickness of the metal structure and can have an annular inner surface. The annular inner surface can be proximal to at least a portion of a conductive outer surface of at least one aligned connector of the plurality of aligned connectors in the test system. The socket can further include an insulation layer provided on the annular inner surface.

32 Claims, 12 Drawing Sheets

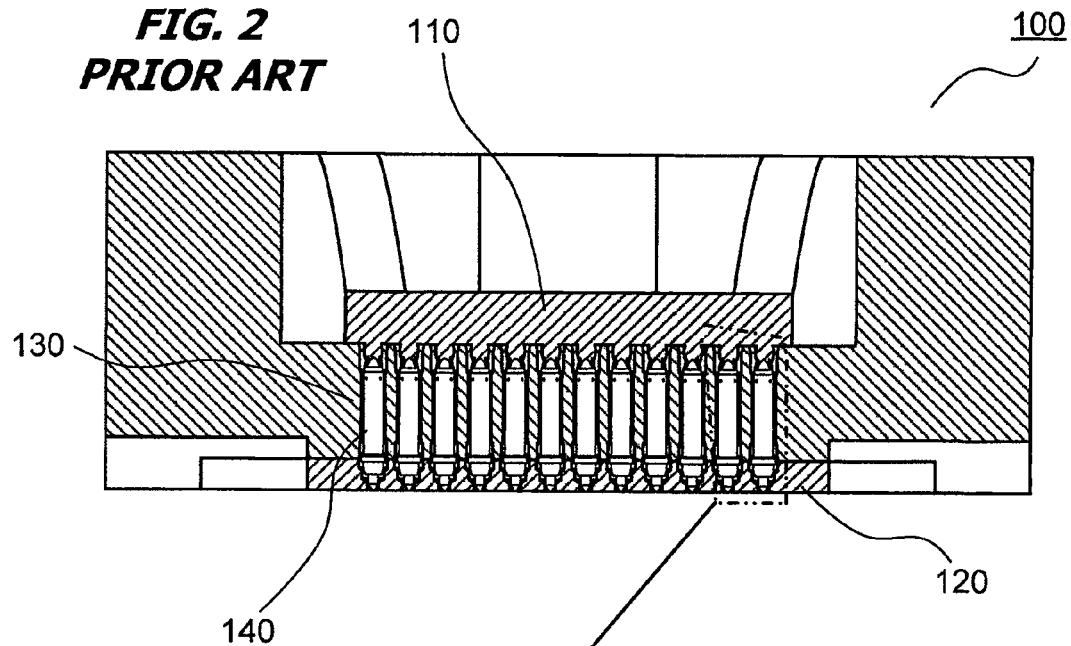

INSULATED METAL SOCKET

PRIORITY

This application claims the benefit of priority from U.S. Provisional Application No. 61/493,720, filed Jun. 6, 2011, which is herein incorporated by reference in its entirety.

TECHNICAL FIELD

The present disclosure relates generally to test systems to test and qualify integrated circuit (IC) chips using a plurality of aligned connectors, and more particularly, to materials, components, and methods directed to the fabrication and use of sockets in test systems.

BACKGROUND

In the electronics and semiconductor industries, systems used to test and qualify integrated circuit (IC) chips during the manufacturing process are conventionally referred to as "test systems." FIGS. 1-3 depict various views of a conventional test system 100, which can provide an electrical connection between an electronic device 110 (which can be an IC chip, and can also be referred to as a "Device Under Test," or "DUT") and a printed circuit board (PCB) (not shown). The test system 100 can include a plurality of aligned connectors 140 (which can be spring probes) for providing an electrical connection between the electronic device 110 and the PCB. The test system 100 can further include a socket 130 and a socket retainer 120, each of which include a plurality of openings to accommodate the plurality of aligned connectors 140, where the plurality of openings in the socket retainer 120 are configured to align with the plurality of openings in the socket 130. FIG. 1 is an exploded view of the test system 100, FIG. 2 is a cross sectional view of the test system 100—depicting the plurality of aligned connectors 140 aligned with at least a portion of the electronic device 110—and FIG. 3 depicts an enlargement of a portion of FIG. 2.

The socket 130 and the socket retainer 120 in the test system 100 are constructed from composite plastic material to insulate each of the plurality of connectors 140 from the others.

A further conventional test system 400 is depicted in FIGS. 4-6, where a portion of the socket assembly and the plurality of connectors 440 provide a coaxial structure. As with the test system 100, the test system 400 can include a plurality of aligned connectors 440 (which can be spring probes configured to operate in a coaxial structure) for providing an electrical connection between the electronic device 110 and the PCB. The test system 400 can include a top socket layer 430, a center socket layer 450, and a bottom socket layer 420. The top socket layer 430, the center socket layer 450, and the bottom socket layer 420 each include a plurality of openings for the plurality of aligned connectors 440, where the plurality of openings in the top socket layer 430, the center socket layer 450, and the bottom socket layer 420 are configured to align to accommodate the plurality of connectors 440 when the test system 400 is being used to provide electrical signals to the electronic device 110. FIG. 4 is an exploded view of the test system 400, FIG. 5 is a cross sectional view of the test system 400—depicting the plurality of aligned connectors 440 aligned with at least a portion of the electronic device 110—and FIG. 6 depicts an enlargement of a portion of FIG. 5.

The top socket layer 430 and the bottom socket layer 420 in the test system 400 are constructed from composite plastic material, which can insulate each of the plurality of connectors 440 from the others. The center socket layer 450 is a conductive material such as a metal, and can provide a coaxial connection for a portion of the connection between the PCB and the electronic device 110, where the electrical impedance presented to a signal passing over the path associated with the connector 440 in the cavity provided by the center socket layer 450 (which can be grounded) is dependent upon the values of a cavity diameter D 475 and a connector diameter d 485. Unlike the center socket layer 450, the top socket layer 430 and the bottom socket layer 420 in the test system 400 do not conventionally provide a coaxial structure when combined with connector 440.

An additional conventional test system 700 is depicted in FIGS. 7-9, where a portion of the socket assembly and the plurality of connectors 440 again provide a coaxial structure. As with the test system 400, the test system 700 can include a plurality of aligned connectors 440 (which again can be spring probes configured to operate in a coaxial structure). The test system 700 can include a socket body 730, a top socket layer 760, a center socket layer 750, a bottom socket layer 720, and an insulation bushing 745. The socket body 730, the top socket layer 760, the center socket layer 750, and the bottom socket layer 720 each include a plurality of openings for the plurality of aligned connectors 440, where the plurality of openings in the socket body 730, the top socket layer 760, the center socket layer 750, and the bottom socket layer 720 are configured to align to accommodate the plurality of connectors 440. The insulation bushing 745 can be used to maintain the plurality of aligned connectors 440 in the cavities formed by the aligned openings. FIG. 7 is an exploded view of the test system 700, FIG. 8 is a cross sectional view of the test system 700—depicting the plurality of aligned connectors 440 aligned with at least a portion of the electronic device 110—and FIG. 9 depicts an enlargement of a portion of FIG. 8.

The socket body 730, the bottom socket layer 720, and the insulation bushing 745 in the test system 700 are constructed from composite plastic material, which can insulate each of the plurality of connectors 440 from the others. The top socket layer 760 and the center socket layer 750 are a conductive material, such as a metal, and can provide a coaxial structure for a portion of the connection between the PCB and the electronic device 110, where the electrical impedance presented to a signal passing over the path associated with the connector 440 in the cavity provided by the center socket layer 750 and the top socket layer 760 (which can be grounded) is dependent upon the values of a cavity diameter D 775 and a connector diameter d 485. Unlike the center socket layer 750 and the top socket layer 760, the socket body 730 and the bottom socket layer 720 in the test system 700 do not provide a coaxial structure when combined with connector 440.

SUMMARY

In one aspect, the present disclosure is directed to a socket for use in a test system, where the test system is configured to align at least a portion of an electronic device with a plurality of aligned connectors. In an aspect, the socket can include a metal structure having a plurality of openings, the plurality of openings spaced to accommodate the plurality of aligned connectors. At least one opening in the plurality of openings can extend through a thickness of the metal structure and can have an annular inner surface. The annular inner surface can be proximal to at least a portion of a conductive outer surface of at least one aligned connector of the plurality of aligned connectors in the test system. The socket can further include an insulation layer provided on the annular inner surface.

In another aspect, the present disclosure is directed to a socket assembly for use in a test system, where the test system is configured to align at least a portion of an electronic device with a plurality of aligned connectors. The socket assembly can include a socket, which itself can include a metal structure having a plurality of openings, the plurality of openings spaced to accommodate the plurality of aligned connectors. At least one opening in the plurality of openings can extend through a thickness of the metal structure and can have an annular inner surface. The annular inner surface can be proximal to at least a portion of a conductive outer surface of at least one aligned connector of the plurality of aligned connectors in the test system. The socket can include an insulation layer provided on the annular inner surface. The socket assembly can further include a socket retainer, which can include a metal retainer having a plurality of annular guide holes extending through the metal retainer and configured to accommodate the plurality of aligned connectors when the socket retainer is aligned with the socket, at least one of the annular guide holes of the plurality of annular guide holes having an annular retainer surface. In an aspect, the socket assembly can include a retainer insulation layer provided on the annular retainer surface, where the retainer insulation layer is configured to align with the insulation layer when the socket retainer is aligned with the socket.

In a further aspect, the present disclosure is directed to a coaxial socket assembly for use in a test system, where the test system is configured to align at least a portion of an electronic device with a plurality of aligned connectors. The coaxial socket assembly can include a socket, which itself can include a metal structure having a plurality of openings, the plurality of openings spaced to accommodate the plurality of aligned connectors. At least one opening in the plurality of openings can extend through a thickness of the metal structure and can have an annular inner surface. The annular inner surface can be proximal to at least a portion of a conductive outer surface of at least one aligned connector of the plurality of aligned connectors in the test system. The socket can include an insulation layer provided on the annular inner surface. The coaxial socket assembly can further include a socket retainer, which can include a metal retainer having a plurality of annular guide holes extending through the metal retainer and configured to accommodate the plurality of aligned connectors when the socket retainer is aligned with the socket, at least one of the annular guide holes of the plurality of annular guide holes having an annular retainer surface. In an aspect, the coaxial socket assembly can include a retainer insulation layer provided on the annular retainer surface, where the retainer insulation layer is configured to align with the insulation layer when the socket retainer is aligned with the socket. The socket retainer and the socket can be configured to present a cavity interface to the at least one aligned connector, and the socket retainer and the socket can be configured to present a substantially constant impedance across the cavity interface to an electrical signal provided across the at least one aligned connector.

In an additional aspect, the present disclosure is directed to a coaxial socket for use in a test system, where the test system is configured to align at least a portion of an electronic device with a plurality of aligned connectors. The coaxial socket can include a conductive structure having a plurality of openings, the plurality of openings spaced to accommodate the plurality of aligned spring probes. At least one opening in the plurality of openings can extend through a thickness of the conductive structure and can have an annular inner surface. The annular inner surface can be proximal to at least a portion of a conductive outer surface of at least one aligned connector of the plurality of aligned connectors in the test system. The coaxial socket can further include a socket retainer, which can include a metal retainer having a plurality of annular guide holes extending through the metal retainer and configured to accommodate the plurality of aligned connectors when the socket retainer is aligned with the conductive structure, at least one of the annular guide holes of the plurality of annular guide holes having an annular retainer surface. In an aspect, the coaxial socket can include a retainer insulation layer provided on the annular retainer surface, where the retainer insulation layer is configured to align with the insulation layer when the socket retainer is aligned with the conductive structure. The socket retainer and the conductive structure can be configured to present a cavity interface to the at least one aligned connector, and the socket retainer and the conductive structure can be configured to present a substantially constant impedance across the cavity interface to an electrical signal provided across the at least one aligned connector.

Additional features and advantages will be set forth in part in the description which follows, being apparent from the description of or learned by practice of the disclosed embodiments. The features and advantages will be realized and attained by means of the elements and combinations particularly pointed out in the appended claims. It is to be understood that both the foregoing general description and the following detailed description are exemplary and explanatory only and are not restrictive of the scope of the embodiments, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

FIG. 2 is a cross-section view of the test system of FIG. 1;

FIG. 3 is a detailed view of a portion of the test system of FIG. 2;

DETAILED DESCRIPTION

Reference will now be made in detail to the exemplary embodiments of the invention, examples of which are illustrated in the accompanying drawings. Wherever possible, the same reference numbers will be used throughout the drawings to refer to the same or like parts.

Figure 10:
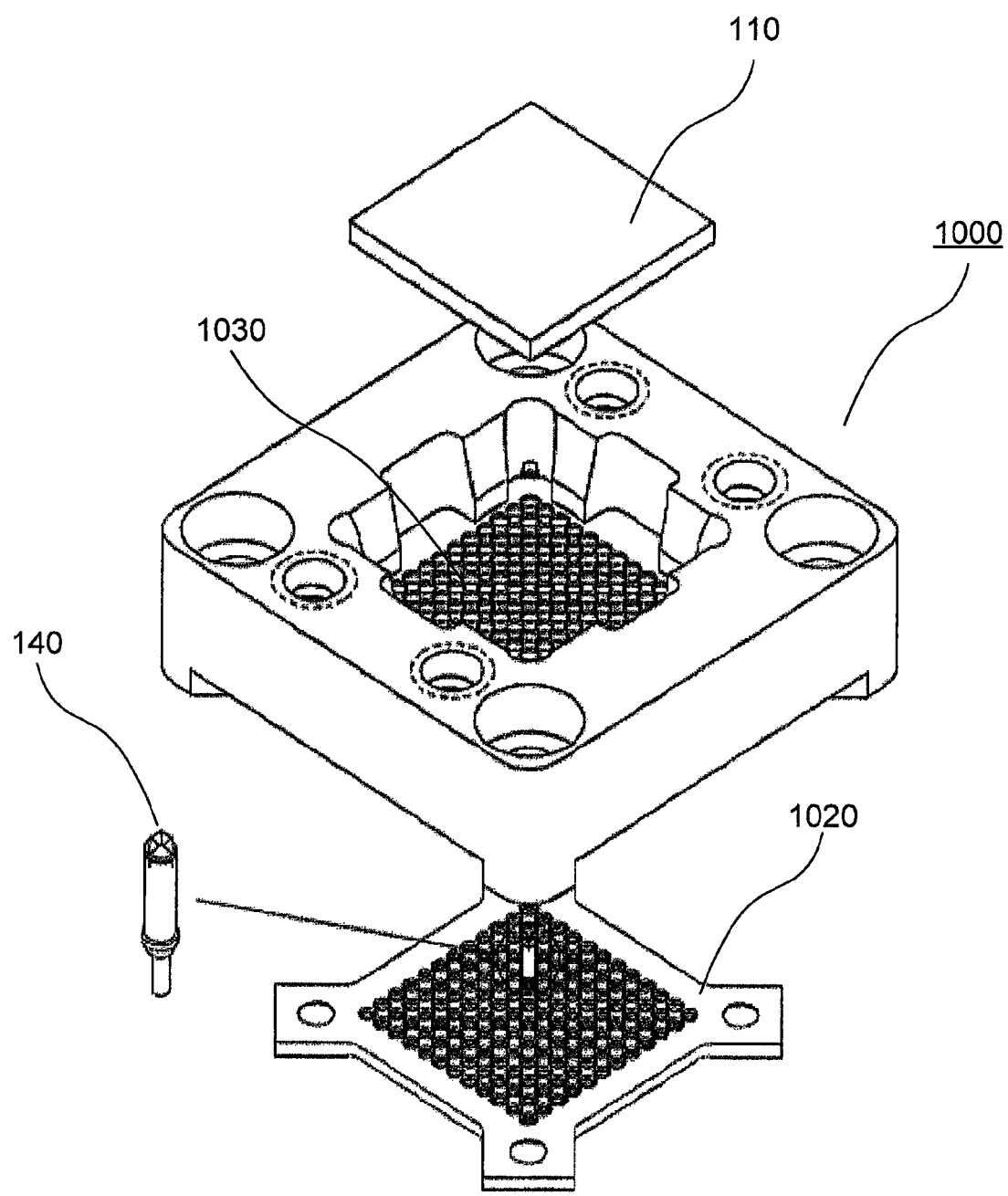
FIG. 10 is an exploded view of a test system consistent with an exemplary embodiment.
Figure 11:
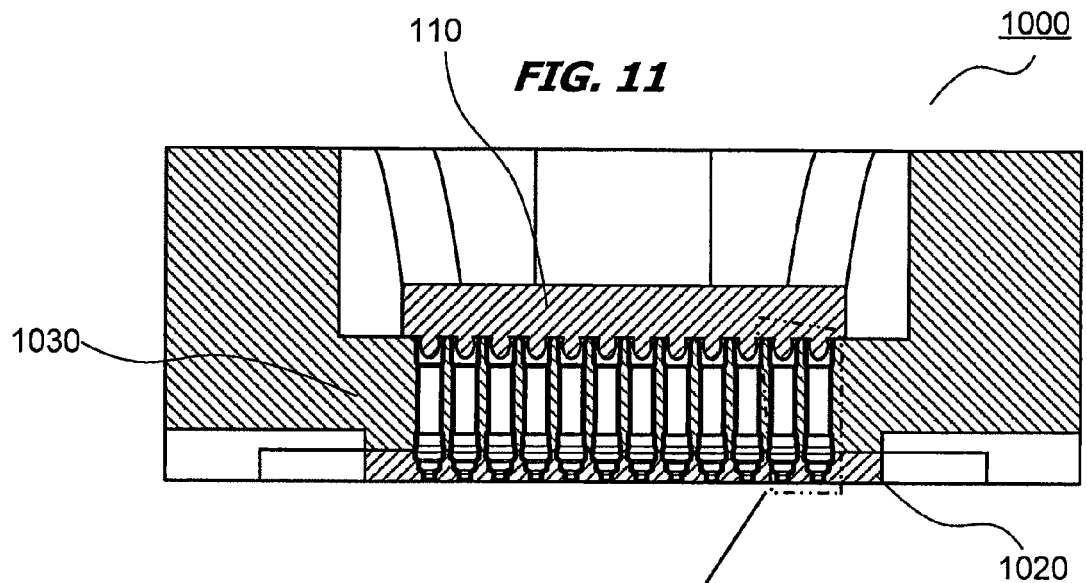
FIG. 11 is a cross-section view of the test system of FIG. 10.
Figure 12:
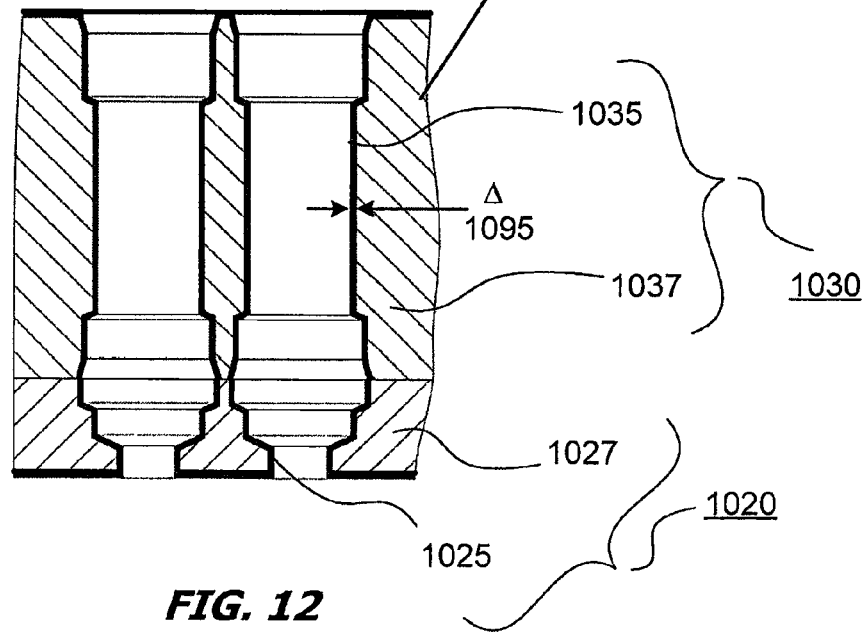
FIG. 12 is a detailed view of a portion of the test system of FIG. 11.

FIGS. 10-12 depict views of a test system 1000 according to an exemplary embodiment. The test system 1000 can include a plurality of aligned connectors 140 for providing an electrical connection between the electronic device 110 and a PCB. In an embodiment, the connectors 140 can be spring probes, or any other suitable electrical connector for use in a test system. The test system 1000 can include a socket 1030 and a socket retainer 1020, each of which includes a plurality of openings to accommodate the plurality of aligned connectors 140. As depicted in FIG. 11, for example, the plurality of openings in the socket retainer 1020 are configured to align with the plurality of openings in the socket 1030. FIG. 10 is an exploded view of the test system 1000, FIG. 11 is a cross sectional view of the test system 1000—depicting the plurality of aligned connectors 140 aligned with at least a portion of the electronic device 110—and FIG. 12 depicts an enlargement of a portion of FIG. 11.

As depicted in FIG. 12, for example, the socket 1030 can comprise a metal structure 1037 and an insulation layer 1035. In addition, the socket retainer 1020 can comprise a metal retainer 1027 and a retainer insulation layer 1025. The connectors 140 are conductive to transport electrical current and are kept from contacting each other in order to avoid an electrical short. The insulation layer 1035 and the retainer insulation layer 1025 can prevent the connectors 140 from contacting the metal structure 1037 and the metal retainer 1027. The insulation layer 1035 and the retainer insulation layer 1025, as depicted in FIG. 12, for example, are provided respectively, on an annular inner surface in the opening of the metal structure 1037 and on an annular surface in the opening of the metal retainer 1027 (as used herein, the latter being an "annular retainer surface"). Accordingly, the insulation layer 1035 and the retainer insulation layer 1025 can prevent the connectors 140 from contacting the metal structure 1037 and the metal retainer 1027. In an embodiment the metal structure 1037 and the metal retainer 1027 can comprise a metal, such as, but not limited to, Al, Mg, Ti, Zr, Cu, Fe and/or an alloy of the same. In addition, the insulation layer 1035 and the retainer insulation layer 1025 can comprise an insulated layer, such as an anodic film generated on the metal (or any such layer on the metal surface generated by an anodizing process) plus a polytetrafluoroethylene (PTFE) coating (conventionally known, for example, by the Du Pont brand name Teflon®). In a preferred embodiment, the metal retainer structure 1037 and the metal retainer 1027 can comprise an Al alloy. Further still, in a preferred embodiment, the insulation layer 1035 and the retainer insulation layer 1025 can comprise anodized Al (generated, for example, according to an electrolytic passivation process as is described, for example, in Sheasby, P. G., Pinner, R. (2001) "The Surface Treatment and Finishing of Aluminum and its Alloys" vol. 2 (sixth ed.) (hereinafter "Sheasby"); and Edwards, Joseph (1997) "Coating and Surface Treatment Systems for Metals," hereinafter "Edwards"). In addition, in a preferred embodiment, the insulation layer 1035 and the retainer insulation layer 1025 can comprise a sealing layer of PTFE Teflon® (generated, for example, as described in, for example, in Sheasby). The anodized Al layer in both or either of the insulation layer 1035 and the retainer insulation layer 1025 can have a thickness greater than about 0.02 mm. The PTFE Teflon® layer in both or either of the insulation layer 1035 and the retainer insulation layer 1025 can have a thickness greater than about 0.001 mm.

As described above, other suitable materials for the metal structure 1037 and the metal retainer 1027 can include Mg, Ti, Zr, Cu, Fe and/or an alloy of the same. For such other materials, a thickness $\Delta$ 1095 of both or either of the insulation layer 1035 and the retainer insulation layer 1025 can be chosen based upon the electrical resistivity and the required electrical breakdown voltage of the insulation layer 1035 and the retainer insulation layer 1025. For example, where the electrical breakdown voltage of an insulation layer as a function of thickness is 30V/μm, an insulation layer that is 10 μm thick can meet a required electrical breakdown value of 300 V. Such technical requirements, (i.e., a required electrical breakdown value of 300 V) can drive the selection of a suitable material and thickness $\Delta$ 1095 for the insulation layer 1035 and the retainer insulation layer 1025.

The socket 1030 depicted in FIGS. 10-12 can have a much higher strength than conventional plastic composite material used in conventional test system 100. For example, the socket 130 of test system 100 can deform under a force associated with the connectors 140 in the socket 130 (where the connectors 140 can be spring pins—and particularly when there are many of them). This deformation can affect the electrical performance of the test system 100. Moreover, the magnitude of the deformation can be related to socket material strength. In contrast, the socket 1030 comprising metal structure 1037 and insulation layer 1035, can have a higher strength than conventional plastic used in socket 130. For example, one indicator of material strength is the elastic modulus of a material. The elastic modulus of socket 1030 comprising an aluminum alloy (metal structure 1037) and a layer of anodized aluminum and PTFE Teflon® (insulation layer 1035) can be about 10 times larger than high strength composite plastic materials alone. Using the same general socket structure and force, the deformation of a socket 1030 can be only about 0.06 mm, compared to a deformation of about 0.25 mm of a high strength composite plastic material. Among other features, and for purposes of example only, the use of test system 1000 with socket 1030 can be useful for testing any electronic device that requires large quantities of spring probe connectors—such as electronic device test systems utilizing more than 1,500 spring probe connectors.

According to a further embodiment, a method of fabricating the socket 1030 includes fabricating the metal structure 1037 to accommodate the plurality of connectors 140. Consistent with an embodiment, the fabricated metal structure 1037 can be coated (and/or a layer can be generated on the surface) using surface coating technology and/or chemical processes. For example, where the metal structure 1037 is an Al alloy, a layer of anodized aluminum can be generated on surfaces of the metal structure 1037 according to conventional anodizing techniques, such as an electrolytic passivation process as is described, for example, in Sheasby and Edwards. Other methods of anodizing the metal structure 1037 can include microplasmic anodizing processes, and can be applied, for example to the metal structure 1037 comprising Mg, Ti, Zr, Cu, Fe and/or an alloy of the same. In addition, in a preferred embodiment, the insulation layer 1035 can comprise a sealing layer of PTFE Teflon® (generated, for example, as described in, for example, in Sheasby), or another suitable coating that provides electrical insulation.

Further still, a method of fabricating the socket retainer 1020 includes fabricating the metal retainer 1027 to accommodate the plurality of connectors 140 and to align with the plurality of openings in the metal structure 1037. The fabricated metal retainer 1027 can be coated (and/or a layer can be generated on the surface) using surface coating technology and/or chemical processes. For example, where the metal retainer 1027 is an Al alloy, a layer of anodized Al can be generated on surfaces of the metal retainer 1027 according to conventional techniques, such as an electrolytic passivation process as is described, for example, in Sheasby and Edwards. Other methods of anodizing the metal retainer 1027 can include microplasmic anodizing processes, and can be applied, for example to the metal retainer 1027 comprising Mg, Ti, Zr, Cu, Fe and/or an alloy of the same. In addition, in a preferred embodiment, the retainer insulation layer 1025 can comprise a sealing layer of PTFE Teflon® (generated, for example, as described in, for example, in Sheasby), or another suitable coating that provides electrical insulation.

Figure 13:
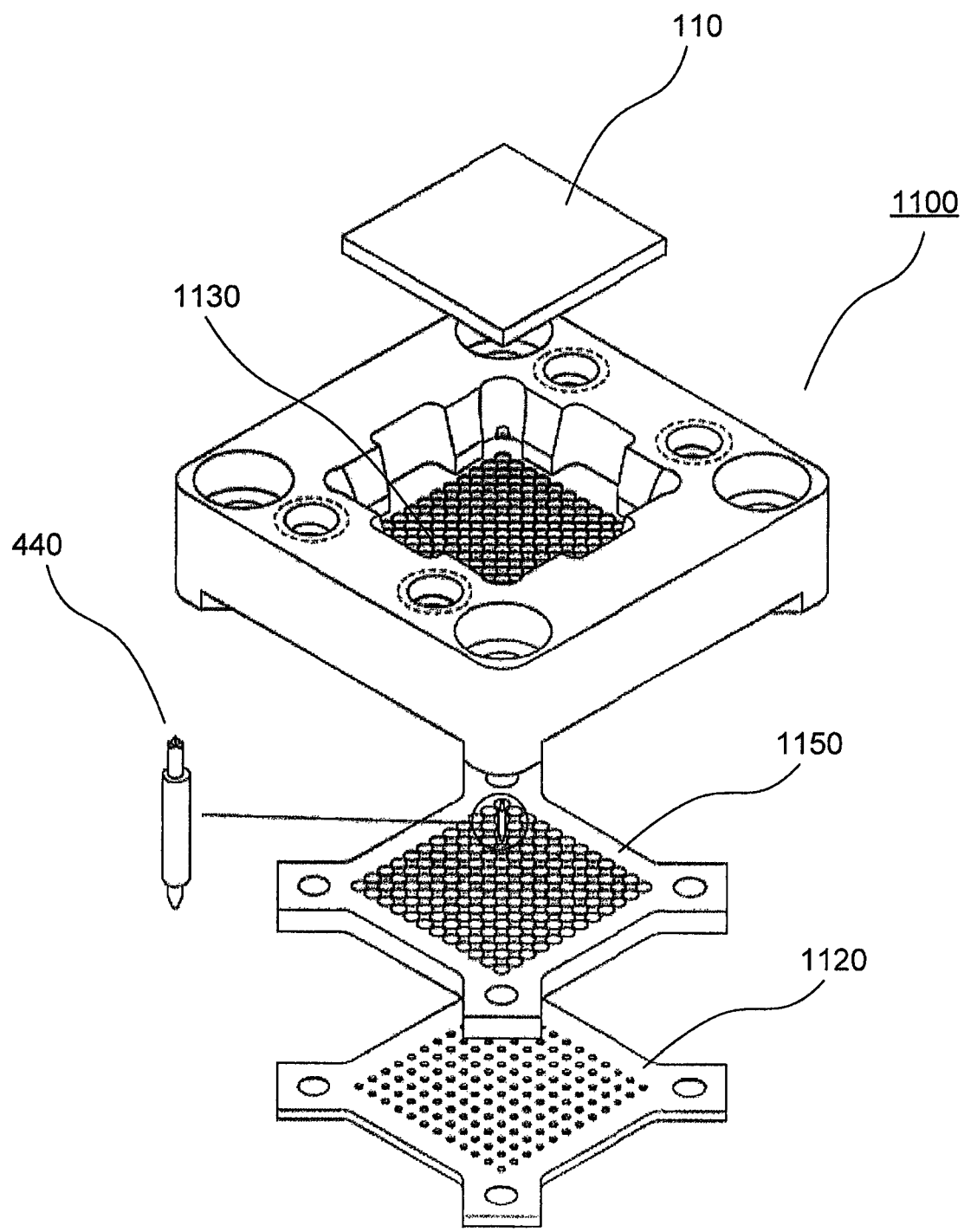
FIG. 13 is an exploded view of a test system consistent with another exemplary embodiment.
Figures 14, 15:
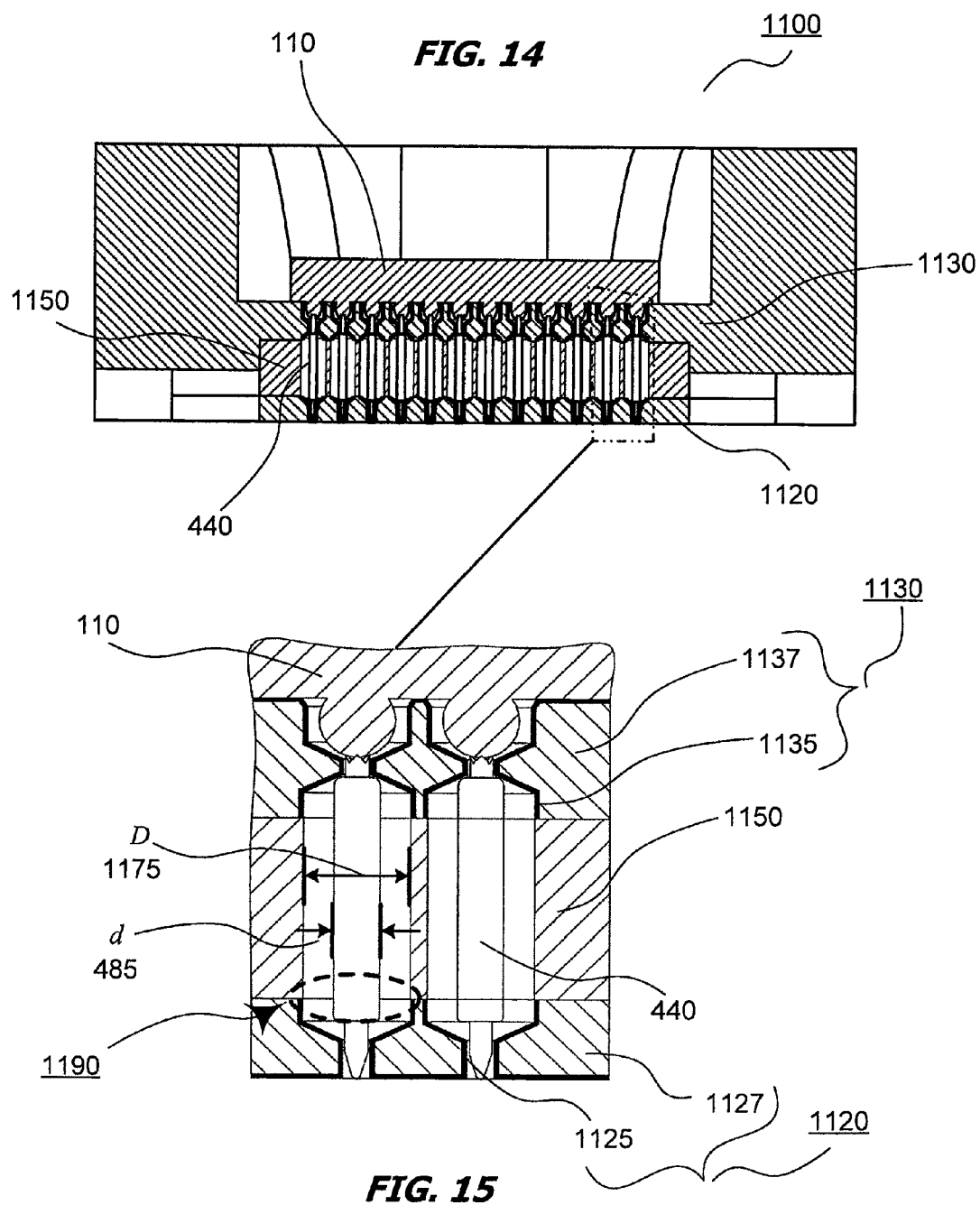
FIG. 14 is a cross-section view of the test system of FIG. 13.
FIG. 15 is a detailed view of a portion of the test system of FIG. 14.

FIGS. 13-15 depict a test system 1100, consistent with a further exemplary embodiment. The test system 1100, as described further below, incorporates a coaxial structure. As with the test system 1000, the test system 1100 can include a plurality of aligned connectors 440 (which can be spring probes configured to operate in a coaxial structure). The plurality of aligned connectors 440 can provide an electrical connection between the electronic device 110 and the PCB. The test system 1100 can include a socket body 1130, a coaxial socket 1150, and a socket retainer 1120. The socket body 1130, the coaxial socket 1150, and the socket retainer 1120 each includes a plurality of openings for the plurality of aligned connectors 440. Furthermore, the plurality of openings in the socket body 1130, the coaxial socket 1150, and the socket retainer 1120 are configured to align to accommodate the plurality of aligned connectors 440. FIG. 13 is an exploded view of the test system 1100, FIG. 14 is a cross sectional view of the test system 1100—depicting the plurality of aligned connectors 440 aligned with at least a portion of the electronic device 110—and FIG. 15 depicts an enlargement of a portion of FIG. 14.

As depicted in FIG. 15, for example, the socket body 1130 can comprise a metal structure 1137 and an insulation layer 1135. In addition, the socket retainer 1120 can comprise a metal retainer 1127 and a retainer insulation layer 1125. As with test system 1000, the connectors 440 in test system 1100 are conductive to transport electrical current and are kept from contacting each other in order to avoid an electrical short. The insulation layer 1135 and the retainer insulation layer 1125 can prevent the connectors 440 from contacting the metal structure 1137 and the metal retainer 1127. The insulation layer 1135 and the retainer insulation layer 1125, as depicted in FIG. 15, for example, are provided respectively, on an annular inner surface in the opening of the metal structure 1137 and on an annular surface in the opening of the metal retainer 1127 (as used herein, the latter being an "annular retainer surface"). In an embodiment the metal structure 1137 and the metal retainer 1127 can comprise a metal, such as, but not limited to, Al, Mg, Ti, Zr, Cu, Fe and/or an alloy of the same. In addition, the insulation layer 1135 and the retainer insulation layer 1125 can comprise an insulated layer, such as an anodic film generated on the metal (or any such layer on the metal surface generated by an anodizing process) plus a PTFE Teflon® coating. In a preferred embodiment, the metal retainer structure 1137 and the metal retainer 1127 can comprise an Al alloy. Further still, in a preferred embodiment, the insulation layer 1135 and the retainer insulation layer 1125 can comprise anodized Al (generated, for example, according to an electrolytic passivation process as is described, for example, in Sheasby and Edwards). In addition, in a preferred embodiment, the insulation layer 1135 and the retainer insulation layer 1125 can comprise a sealing layer of PTFE Teflon® (generated, for example, as described in, for example, in Sheasby). The anodized Al layer in both or either of the insulation layer 1135 and the retainer insulation layer 1125 can have a thickness greater than about 0.02 mm. The PTFE Teflon® layer in both or either of the insulation layer 1135 and the retainer insulation layer 1125 can have a thickness greater than about 0.001 mm.

As described above, other suitable materials for the metal structure 1137 and the metal retainer 1127 can include Mg, Ti, Zr, Cu, Fe and/or an alloy of the same. For such other materials, a thickness Δ of both or either of the insulation layer 1135 and the retainer insulation layer 1125 can be chosen based upon the electrical resistivity and the required electrical breakdown voltage of the insulation layer 1135 and the retainer insulation layer 1125. For example, where the electrical breakdown voltage of an insulation layer as a function of thickness is 30V/μm, an insulation layer that is 10 μm thick can meet a required electrical breakdown value of 300 V. Such technical requirements, (i.e., a required electrical breakdown value of 300 V) can drive the selection of a suitable material and thickness Δ for the insulation layer 1135 and the retainer insulation layer 1125.

The coaxial socket 1150 can comprise a Cu alloy, and can be set to ground. Moreover, the socket body 1130, the coaxial socket 1150, and the socket retainer 1120 can be configured to present a cavity with a coaxial structure to an electrical signal passing between a PCB and the electronic device 110 through the connector 440. For example, the coaxial socket 1150 can be in electrical contact with the metal structure 1137 and the retainer metal structure 1127, and all of the coaxial socket 1150, the metal structure 1137, and the retainer metal structure 1127 can be set to ground. Accordingly, the test system 1100 can be configured to present a controlled impedance to the electrical signals passing between the PCB and the electronic device. For example, FIG. 15 depicts a portion of a cavity interface 1190 associated with the interface between an opening of the coaxial socket 1150 and an opening of the socket retainer 1120. In particular, and consistent with an embodiment, the coaxial socket 1150 and the socket retainer 1120 can be configured to present a substantially constant impedance across the portion of the cavity interface 1190 to an electrical signal provided across connector 440. The impedance can be further controlled across much of the cavity from the opening at the lower portion of the socket retainer 1120 (configured to align with a PCB) to the opening at the upper portion of the socket body 1130 (configured to align with the electronic device 110) so as to provide a matched impedance to incoming electrical signals and currents. For example, the transmission line impedance $Z_0$ of a coaxial transmission path (such as the path depicted in FIG. 15 associated with the connector 440, the cavity diameter D 1175, and the connector diameter d 485) can be represented by the formula:

$$Z_0 = \frac{1}{2\pi}\sqrt{\frac{\mu}{\epsilon}}\ln\frac{D}{d} \approx \frac{138}{\sqrt{\epsilon_r}}\log_{10}\frac{D}{d}$$

Figure 1:
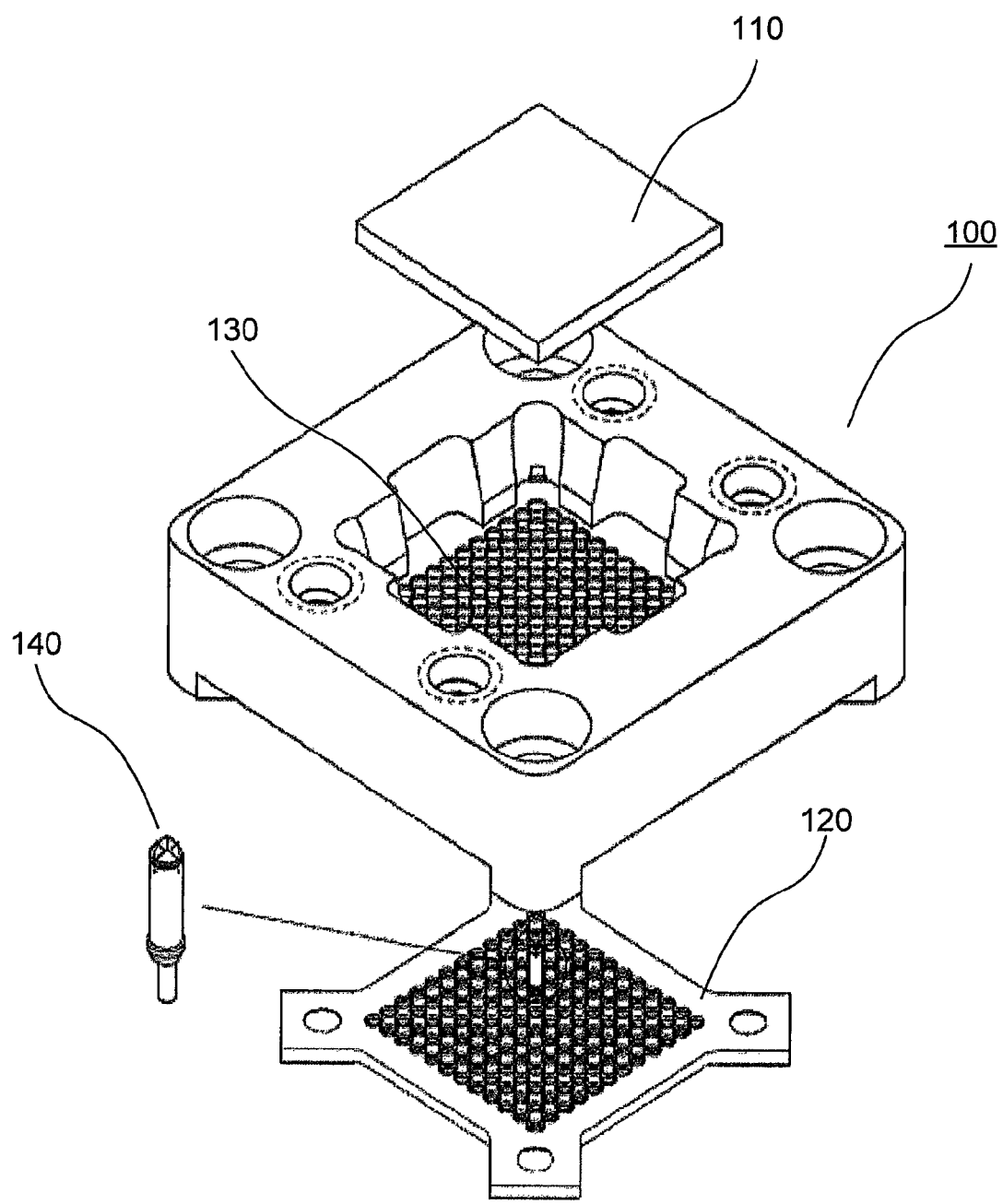
FIG. 1 is an exploded view of a conventional test system.
Figure 4:
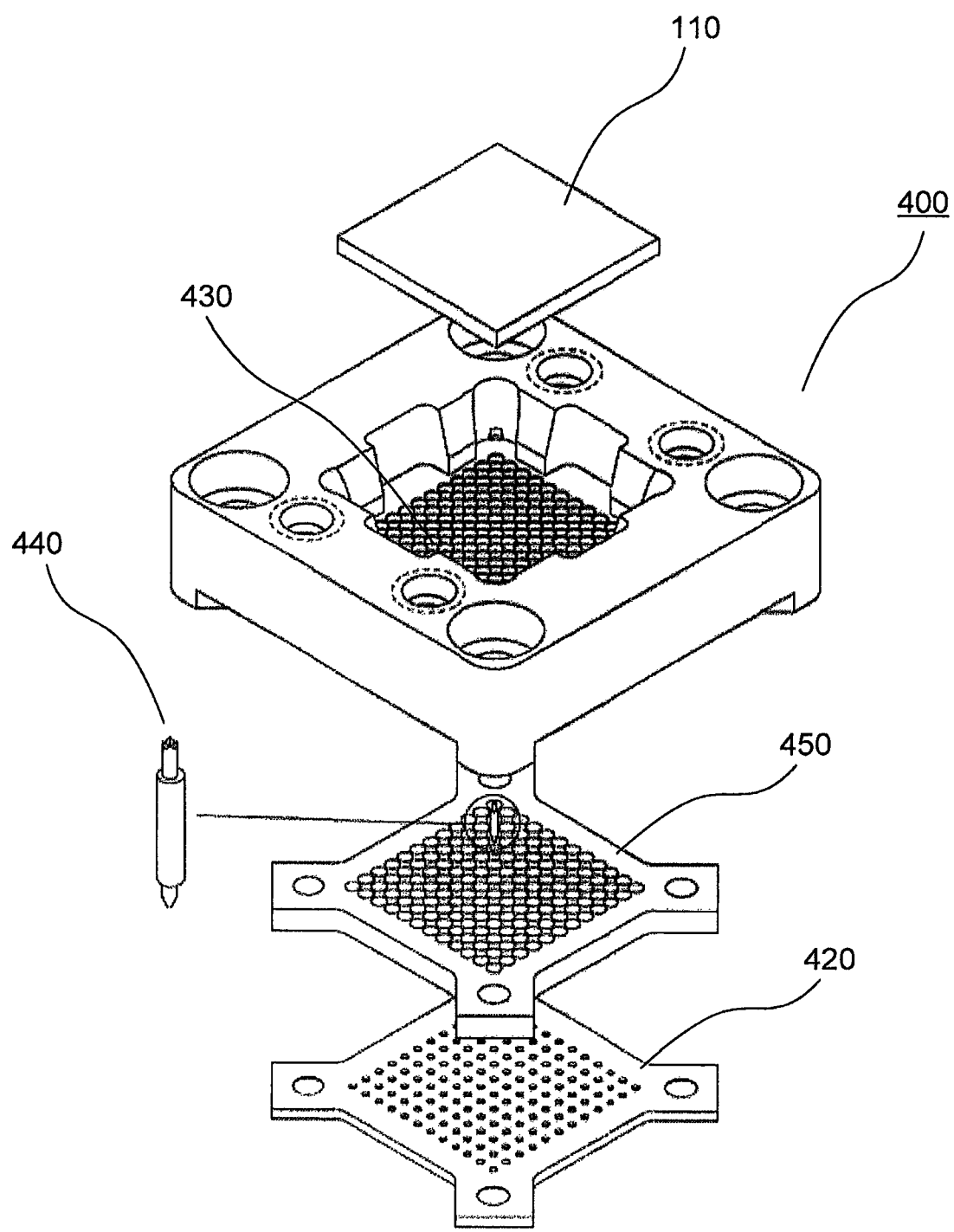
FIG. 4 is an exploded view of another conventional test system.
Figure 5:
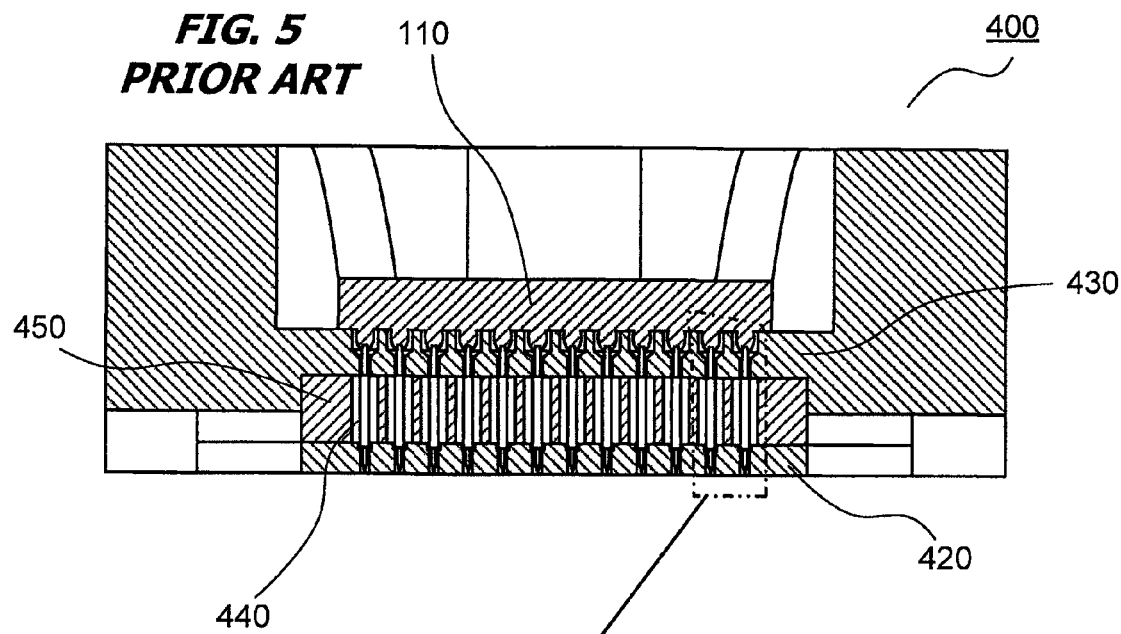
FIG. 5 is a cross-section view of the test system of FIG. 4.
Figure 6:
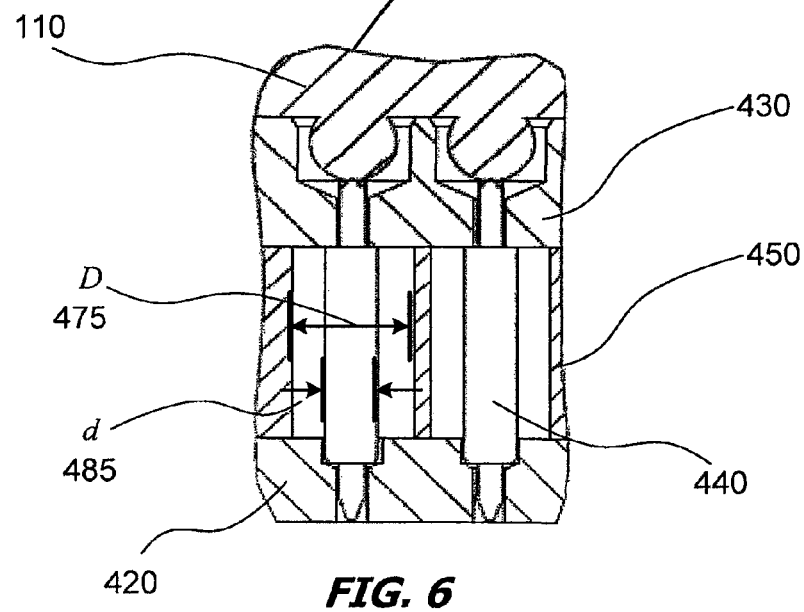
FIG. 6 is a detailed view of a portion of the test system of FIG. 5.
Figure 7:
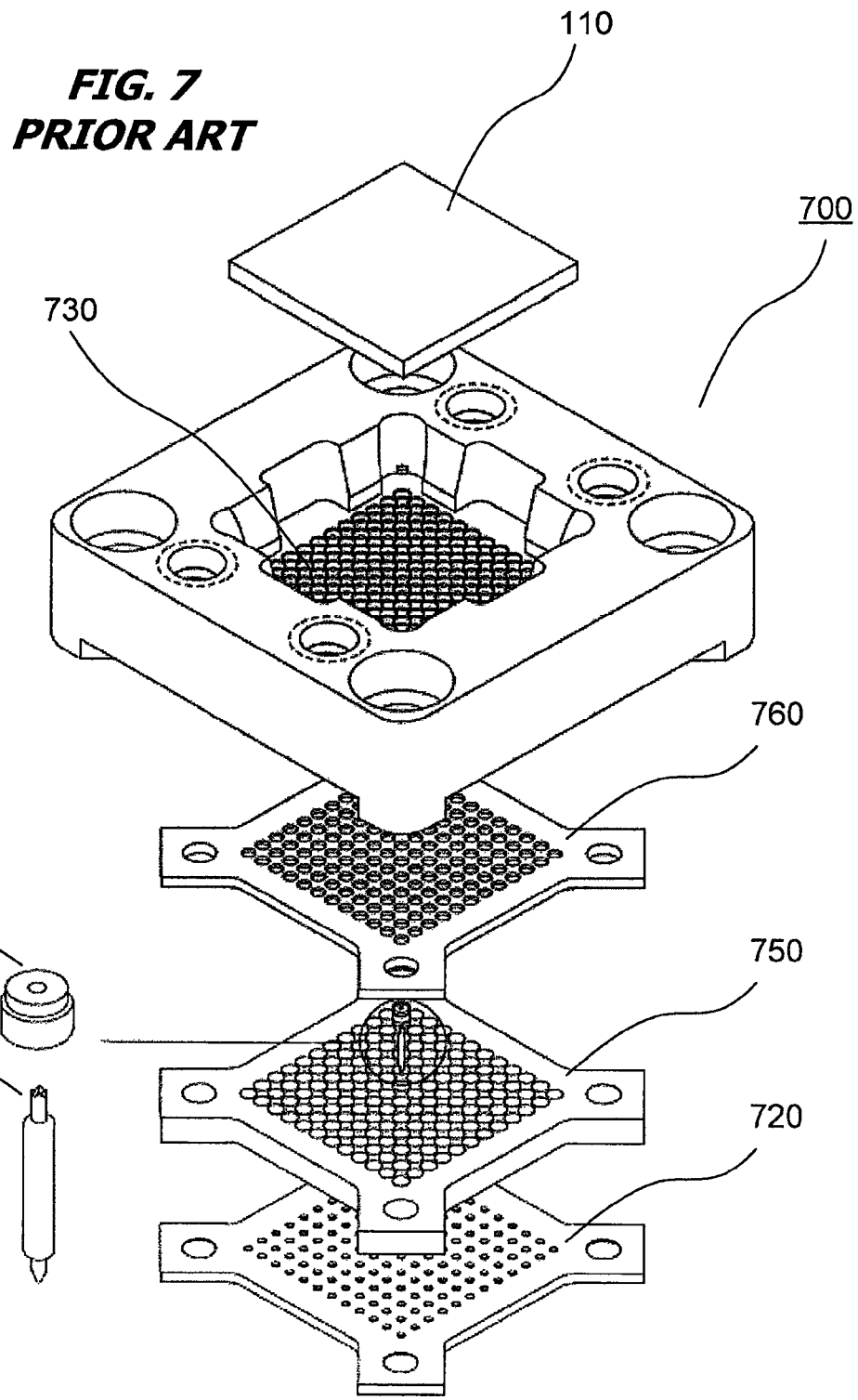
FIG. 7 is an exploded view of a further conventional test system.
Figure 8:
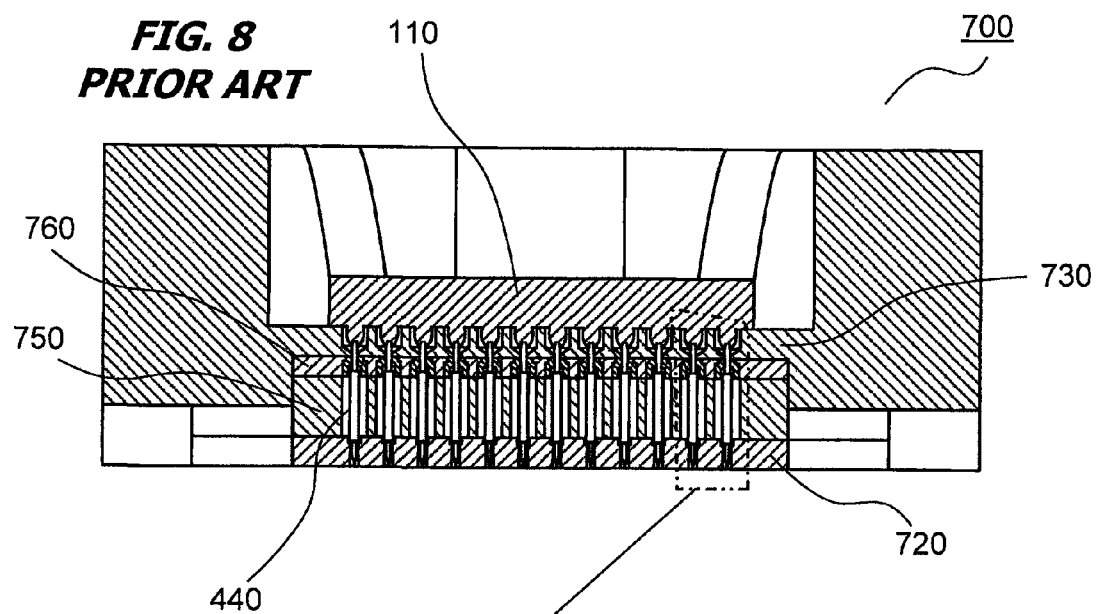
FIG. 8 is a cross-section view of the test system of FIG. 7.
Figure 9:
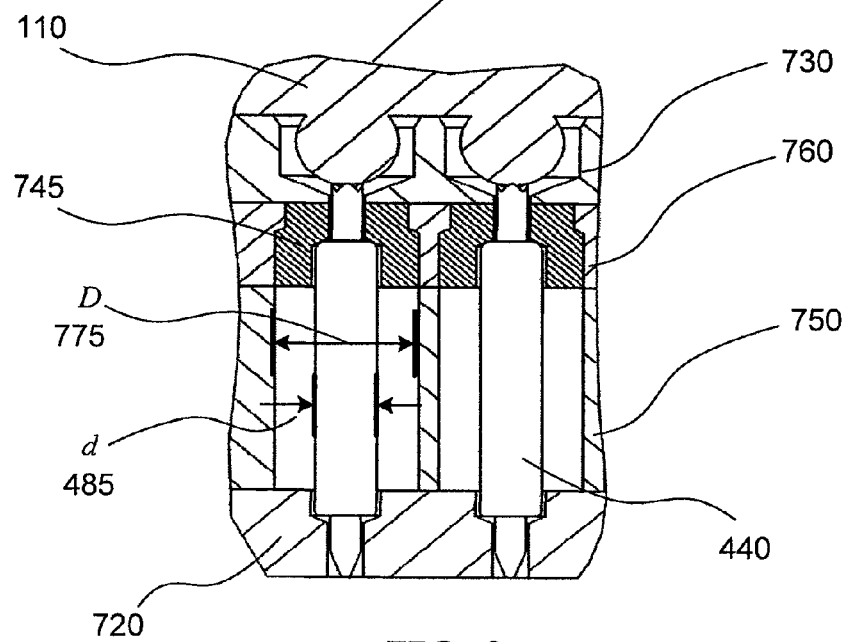
FIG. 9 is a detailed view of a portion of the test system of FIG. 8.

By way of example only, the cavity diameter D 1175 can be filled with air, $\epsilon_r=1.0$. Accordingly, depending upon the values the cavity diameter contiguous to D 1175 and associated with the cavity depicted in FIG. 15 within the socket body 1130 and the relative permittivity $\epsilon_r$ associated with the combination of air and the insulation layer 1135, and the values of the cavity diameter contiguous to D 1175 within the socket retainer 1120 and the relative permittivity $\epsilon_r$ associated with the combination of air and insulation layer 1125, a coaxial transmission path can be provided which is an improvement over the conventional coaxial transmission path depicted in FIGS. 6 and 9.

The signal integrity performance of the test system 1100 can be an improvement over that of the test system 400 and the test system 700 at signal frequencies greater than about 15 GHz. In particular, the signal integrity performance of the test system 1100 can be better than that of conventional test systems with coaxial structures (such as the test system 400 and the test system 700) at signal frequencies greater than about 20 GHz, about 25 GHz, and about 30 GHz.

As with test system 1000, the socket body 1130 depicted in FIGS. 13-15 can have a much higher strength than conventional plastic composite material used in conventional test systems. Similar to the description above in connection with the test system 100, the top socket layer 430 in the test system 400 can deform under a force associated with the connectors 440 in the top socket layer 430 (where the connectors 440 can be spring pins—particularly when there are many of them). This deformation can affect the electrical performance of the test system 400. Moreover, the magnitude of the deformation can be related to socket material strength. In contrast, the socket body 1130 comprising the metal structure 1137 and the insulation layer 1135, can have a higher strength than conventional plastic used in the top socket layer 430. Again, the elastic modulus of the socket body 1130 comprising an aluminum alloy (the metal structure 1137) and a layer of anodized aluminum and PTFE Teflon® (the insulation layer 1135) can be about 10 times larger than high strength composite plastic materials. Using the same general socket structure and force, the deformation of the socket body 1130 can be only about 0.06 mm, compared to a deformation of about 0.25 mm of a high strength composite plastic material. Among other features, and for purposes of example only, this can be useful for testing any electronic device that requires large quantities of spring probe connectors—such as test systems that use more than 1,500 spring probe connectors.

According to a further embodiment, a method of fabricating the socket body 1130 includes fabricating the metal structure 1137 to accommodate the plurality of connectors 440. Consistent with an embodiment, the fabricated metal structure 1137 can be coated (and/or a layer can be generated on the surface) using surface coating technology and/or chemical processes. For example, where the metal structure 1137 is an Al alloy, a layer of anodized aluminum can be generated on surfaces of the metal structure 1137 according to conventional anodizing techniques, such as an electrolytic passivation process as is described, for example, in Sheasby and Edwards. Other methods of anodizing the metal structure 1137 can include microplasmic anodizing processes, and can be applied, for example to the metal structure 1137 comprising Mg, Ti, Zr, Cu, Fe and/or an alloy of the same. In addition, in a preferred embodiment, the insulation layer 1135 can comprise a sealing layer of PTFE Teflon® (generated, for example, as described in, for example, in Sheasby), or another suitable coating that provides electrical insulation.

In addition, a method of fabricating the socket retainer 1120 includes fabricating the metal retainer 1127 to accommodate the plurality of connectors 440 and to align with the plurality of openings in the metal structure 1137. The fabricated metal retainer 1127 can be coated (and/or a layer can be generated on the surface) using surface coating technology and/or chemical processes. For example, where the metal retainer 1127 is an Al alloy, a layer of anodized Al can be generated on surfaces of the metal retainer 1127 according to conventional techniques, such as an electrolytic passivation process as is described, for example, in Sheasby and Edwards. Other methods of anodizing the metal retainer 1127 can include microplasmic anodizing processes, and can be applied, for example to the metal retainer 1127 comprising Mg, Ti, Zr, Cu, Fe and/or an alloy of the same. In addition, in a preferred embodiment, the retainer insulation layer 1125 can comprise a sealing layer of PTFE Teflon® (generated, for example, as described in, for example, in Sheasby), or another suitable coating that provides electrical insulation.

Figure 16:
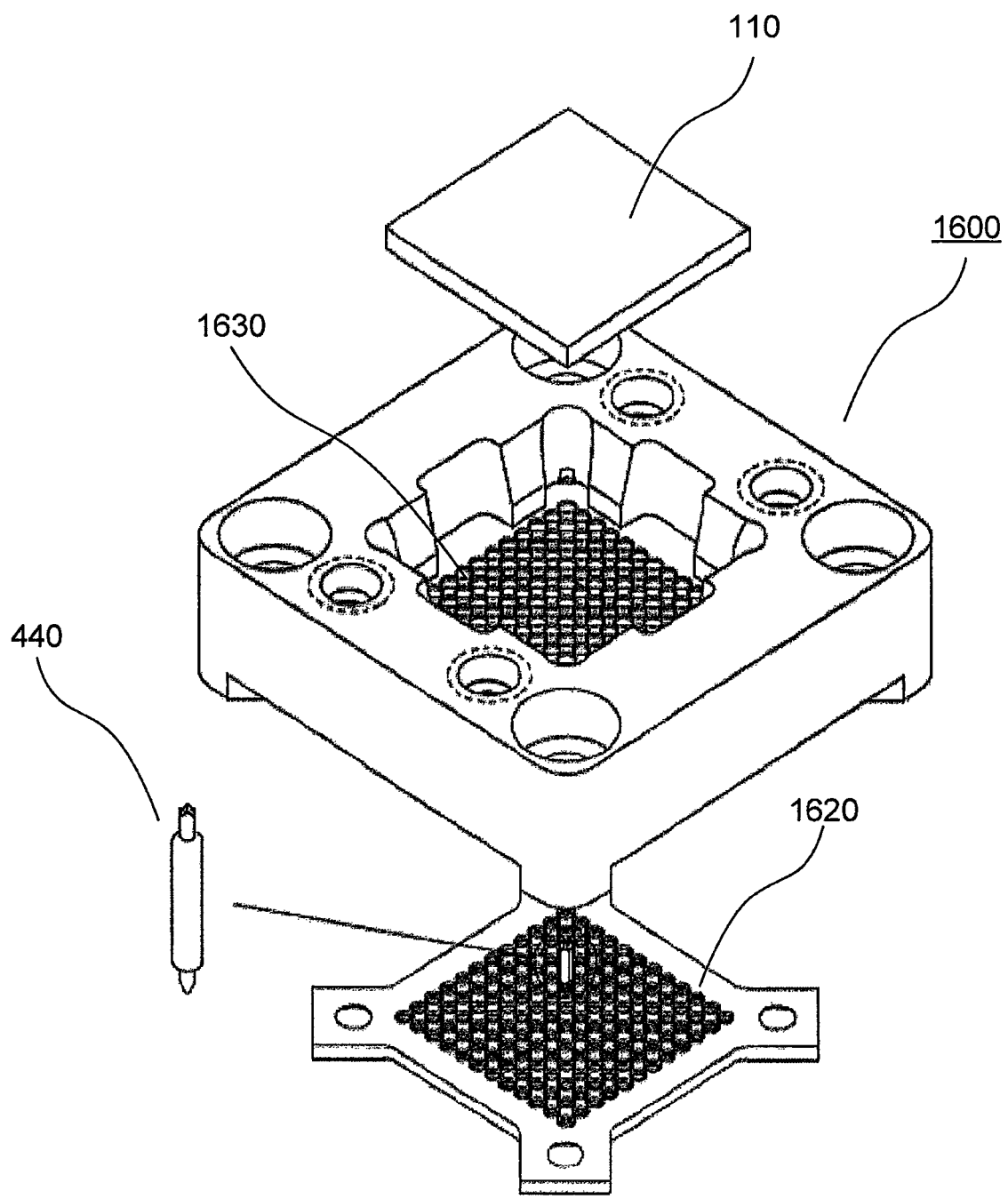
FIG. 16 is an exploded view of a test system consistent with further exemplary embodiment.
Figure 17:
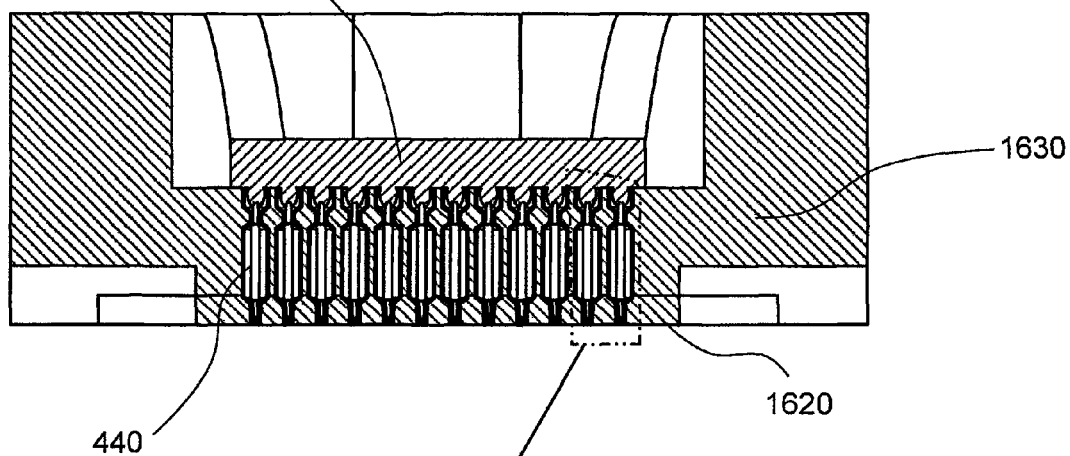
FIG. 17 is a cross-section view of the test system of FIG. 16.
Figure 18:
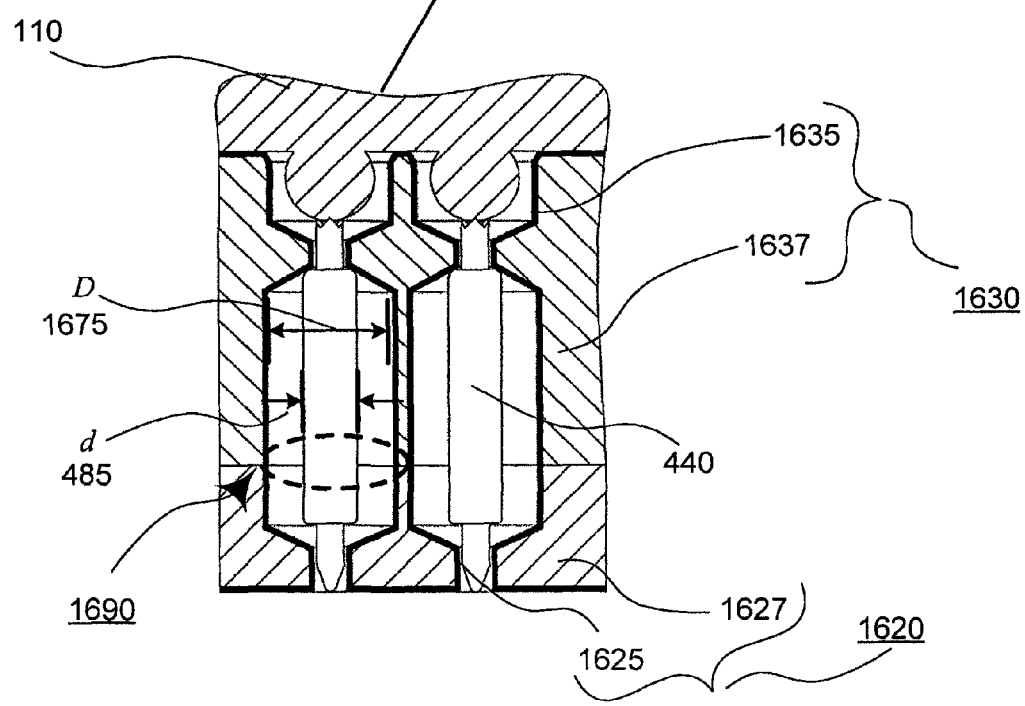
FIG. 18 is a detailed view of a portion of the test system of FIG. 17.

FIGS. 16-18 depict a test system 1600, consistent with a further exemplary embodiment. As with the test system 1100, the test system 1600 incorporates a coaxial structure. In addition, as with the test system 1100, the test system 1600 can include a plurality of aligned connectors 440 (which can be spring probes configured to operate in a coaxial structure). The plurality of aligned connectors 440 can provide an electrical connection between the electronic device 110 and the PCB. The test system 1600 can include a socket body 1630 and a socket retainer 1620. The socket body 1630 and the socket retainer 1620 each includes a plurality of openings for the plurality of aligned connectors 440. Furthermore, the plurality of openings in the socket body 1630 and the socket retainer 1620 are configured to align to accommodate the plurality of aligned connectors 440. FIG. 16 is an exploded view of the test system 1600, FIG. 17 is a cross sectional view of the test system 1600—depicting the plurality of aligned connectors 440 aligned with at least a portion of the electronic device 110—and FIG. 18 depicts an enlargement of a portion of FIG. 17.

As depicted in FIG. 18, for example, the socket body 1630 can comprise a metal structure 1637 and an insulation layer 1635. In addition, the socket retainer 1620 can comprise a metal retainer 1627 and a retainer insulation layer 1625. As with test system 1100, the connectors 440 in test system 1600 are conductive to transport electrical current and are kept from contacting each other in order to avoid an electrical short. The insulation layer 1635 and the retainer insulation layer 1625 can prevent the connectors 440 from contacting the metal structure 1637 and the metal retainer 1627. The insulation layer 1635 and the retainer insulation layer 1625, as depicted in FIG. 18, for example, are provided respectively, on an annular inner surface in the opening of the metal structure 1637 and on an annular surface in the opening of the metal retainer 1627 (as used herein, the latter being an "annular retainer surface"). In an embodiment the metal structure 1637 and the metal retainer 1627 can comprise a metal, such as, but not limited to, Al, Mg, Ti, Zr, Cu, Fe and/or an alloy of the same. In addition, the insulation layer 1635 and the retainer insulation layer 1625 can comprise an insulated layer, such as an anodic film generated on the metal (or any such layer on the metal surface generated by an anodizing process) plus a PTFE Teflon® coating. In a preferred embodiment, the metal retainer structure 1637 and the metal retainer 1627 can comprise an Al alloy. Further still, in a preferred embodiment, the insulation layer 1635 and the retainer insulation layer 1625 can comprise anodized Al (generated, for example, according to an electrolytic passivation process as is described, for example, in Sheasby and Edwards). In addition, in a preferred embodiment, the insulation layer 1635 and the retainer insulation layer 1625 can comprise a sealing layer of PTFE Teflon® (generated, for example, as described in, for example, in Sheasby). The anodized Al layer in both or either of the insulation layer 1635 and the retainer insulation layer 1625 can have a thickness greater than about 0.02 mm. The PTFE Teflon® layer in both or either of the insulation layer 1635 and the retainer insulation layer 1625 can have a thickness greater than about 0.001 mm.

As described above, other suitable materials for the metal structure 1637 and the metal retainer 1627 can include Mg, Ti, Zr, Cu, Fe and/or an alloy of the same. For such other materials, a thickness Δ of both or either of the insulation layer 1635 and the retainer insulation layer 1625 can be chosen based upon the electrical resistivity and the electrical breakdown voltage of the insulation layer 1635 and the retainer insulation layer 1625. For example, where the electrical breakdown voltage of an insulation layer as a function of thickness is 30V/μm, an insulation layer that is 10 μm thick can meet a required electrical breakdown value of 300 V. Such technical requirements, (i.e., a required electrical breakdown value of 300 V) can drive the selection of a suitable material and thickness Δ for the insulation layer 1635 and the retainer insulation layer 1625.

The socket body 1630 and the socket retainer 1620 can be configured to present a cavity with a coaxial structure to an electrical signal passing between a PCB and the electronic device 110 through the connector 440. For example, the metal structure 1637 of the socket body 1630 can be in electrical contact with the retainer metal structure 1627 of the socket retainer 1620, and all of the metal structure 1637 and the retainer metal structure 1627 can be set to ground. Accordingly, the test system 1600 can be configured to present a controlled impedance to the electrical signals passing between the PCB and the electronic device. For example, FIG. 18 depicts a portion of a cavity interface 1690 associated with the interface between an opening of the socket body 1630 and an opening of the socket retainer 1620. In particular, and consistent with an embodiment, the socket body 1630 and the socket retainer 1620 can be configured to present a substantially constant impedance across the portion of the cavity interface 1690 to an electrical signal provided across connector 440. The impedance can be further controlled across the much of the cavity from the opening at the lower portion of the socket retainer 1620 (configured to align with a PCB) to the opening at the upper portion of the socket body 1630 (configured to align with the electronic device 110) so as to provide a matched impedance to incoming electrical signals and currents. Supposing that the cavity is filled with air, then depending upon the values the cavity diameter contiguous to D 1675 and associated with the cavity depicted in FIG. 18 within the socket body 1630 and the relative permittivity $\epsilon_r$ associated with the combination of air and the insulation layer 1635, and the values of the cavity diameter contiguous to D 1675 within the socket retainer 1620 and the relative permittivity $\epsilon_r$ associated with the combination of air and insulation layer 1625, a coaxial transmission path can be provided which is an improvement over the conventional coaxial transmission path depicted in FIGS. 6 and 9.

As with the test system 1100, the signal integrity performance of the test system 1600 can be an improvement over that of the test system 400 and the test system 700 at signal frequencies greater than about 15 GHz. In particular, the signal integrity performance of the test system 1600 can be better than that of the conventional test systems with coaxial structures at signal frequencies greater than about 20 GHz, about 25 GHz, and about 30 GHz.

In addition, as with the test system 1100, the socket body 1630 depicted in FIGS. 15-18 can have a much higher strength than conventional plastic composite material used in conventional test systems. As described above in connection with the test system 400, a top socket layer 430 can deform under a force associated with the connectors 440 in the top socket layer 430 (where the connectors 440 can be spring pins—particularly when there are many of them). This deformation can affect the electrical performance of the test system 400. Moreover, the magnitude of the deformation can be related to socket material strength. In contrast, the socket body 1630 comprising the metal structure 1637 and the insulation layer 1135, can have a higher strength than conventional plastic used in the top socket layer 430. Again, the elastic modulus of the socket body 1630 comprising an aluminum alloy (the metal structure 1637) and a coating of anodized aluminum and Teflon (the insulation layer 1635) can be about 10 times larger than high strength composite plastic materials. Using the same general socket structure and force, the deformation of the socket body 1630 can be only about 0.06 mm, compared to a deformation of about 0.25 mm of a high strength composite plastic material. Among other features, and for purposes of example only, this can be useful for test systems utilizing large quantities of spring probe connectors—such as test systems that use more than 1,500 spring probe connectors.

According to a further embodiment, a method of fabricating the socket body 1630 includes fabricating the metal structure 1637 to accommodate the plurality of connectors 440. Consistent with an embodiment, the fabricated metal structure 1637 can be coated (and/or a layer can be generated on the surface) using surface coating technology and/or chemical processes. For example, where the metal structure 1637 is an Al alloy, a layer of anodized aluminum can be generated on surfaces of the metal structure 1637 according to conventional anodizing techniques, such as an electrolytic passivation process as is described, for example, in Sheasby and Edwards. Other methods of anodizing the metal structure 1637 can include microplasmic anodizing processes, and can be applied, for example to the metal structure 1637 comprising Mg, Ti, Zr, Cu, Fe and/or an alloy of the same. In addition, in a preferred embodiment, the insulation layer 1635 can comprise a sealing layer of PTFE Teflon® (generated, for example, as described in, for example, in Sheasby), or another suitable coating that provides electrical insulation.

In addition, a method of fabricating the socket retainer 1620 includes fabricating the metal retainer 1627 to accommodate the plurality of connectors 440 and to align with the plurality of openings in the metal structure 1637. The fabricated metal retainer 1627 can be coated (and/or a layer can be generated on the surface) using surface coating technology and/or chemical processes. For example, where the metal retainer 1627 is an Al alloy, a layer of anodized Al can be generated on surfaces of the metal retainer 1627 according to conventional techniques, such as an electrolytic passivation process as is described, for example, in Sheasby and Edwards. Other methods of anodizing the metal retainer 1627 can include microplasmic anodizing processes, and can be applied, for example to the metal retainer 1627 comprising Mg, Ti, Zr, Cu, Fe and/or an alloy of the same. In addition, in a preferred embodiment, the retainer insulation layer 1125 can comprise a sealing layer of PTFE Teflon® (generated, for example, as described in, for example, in Sheasby), or another suitable coating that provides electrical insulation.

It will be apparent to those skilled in the art that various modifications and variations can be made in the disclosed systems and processes without departing from the scope of the disclosure. That is, other embodiments will be apparent to those skilled in the art from consideration of the specification and practice of the disclosure. It is intended that the specification and examples be considered as exemplary only, with a true scope being indicated by the following claims and their equivalents.

What is claimed is:

1. A coaxial socket assembly for use in a test system, the test system configured to align at least a portion of an electronic device with a plurality of aligned connectors, the coaxial socket assembly comprising:
   a socket comprising:
      a metal structure having a plurality of openings, the plurality of openings spaced to accommodate the plurality of aligned connectors, at least one opening in the plurality of openings extending through a thickness of the metal structure, the at least one opening having an annular inner surface, the annular inner surface being proximal to at least a portion of a conductive outer surface of at least one aligned connector of the plurality of aligned connectors in the test system; and
      an insulation layer provided on the annular inner surface; and
   a socket retainer comprising:
      a metal retainer including a plurality of annular guide holes extending through the metal retainer and configured to accommodate the plurality of aligned connectors when the socket retainer is aligned with the socket, at least one of the annular guide holes of the plurality of annular guide holes having an annular retainer surface; and
      a retainer insulation layer provided on the annular retainer surface, the retainer insulation layer configured to align with the insulation layer provided on the annular inner surface when the socket retainer is aligned with the socket, the socket retainer and the socket configured to present a cavity interface to the at least one aligned connector;
   wherein the socket retainer and the socket are configured to present a substantially constant impedance across the cavity interface to an electrical signal provided across the at least one aligned connector.

2. The coaxial socket assembly of claim 1, wherein the insulation layer is configured to insulate the conductive outer surface of the at least one aligned connector from the annular inner surface.

3. The coaxial socket assembly of claim 1, wherein the metal structure comprises an aluminum alloy material.

4. The coaxial socket assembly of claim 1, wherein the metal structure comprises at least one of a set of materials including: Mg, Ti, Zr, Cu, and Fe.

5. The coaxial socket assembly of claim 1, wherein the metal retainer comprises aluminum alloy material.

6. The coaxial socket assembly of claim 1, wherein the metal retainer comprises at least one of a set of materials including: Mg, Ti, Zr, Cu, and Fe.

7. The coaxial socket assembly of claim 1, wherein the electrical signal is at a frequency greater than 20 GHz.

8. The coaxial socket assembly of claim 1, wherein the electrical signal is at a frequency greater than 25 GHz.

9. The coaxial socket assembly of claim 1, wherein the electrical signal is at a frequency greater than 30 GHz.

10. The coaxial socket assembly of claim 1, wherein the insulation layer comprises anodized aluminum and a polytetrafluoroethylene (PTFE) coating.

11. The coaxial socket assembly of claim 10, wherein the anodized aluminum has a thickness greater than approximately 0.02 mm.

12. The coaxial socket assembly of claim 10, wherein the polytetrafluoroethylene (PTFE) coating has a thickness greater than about 0.001 mm.

13. The coaxial socket assembly of claim 1, wherein the retainer insulation layer comprises anodized aluminum and a polytetrafluoroethylene (PTFE) coating.

14. The coaxial socket assembly of claim 13, wherein the anodized aluminum in the retainer insulation layer has a thickness greater than approximately 0.02 mm.

15. The coaxial socket assembly of claim 13, wherein the polytetrafluoroethylene (PTFE) coating in the retainer insulation layer has a thickness greater than about 0,001 mm.

16. The coaxial socket assembly of claim 1, wherein the at least one aligned connector is a spring probe.

17. The coaxial socket assembly of claim 16, wherein the metal structure comprises aluminum, alloy material.

18. The coaxial socket assembly of claim 16, wherein the metal structure comprises at least one of a set of materials including: Mg, Ti, Zr, Cu, and Fe.

19. The coaxial socket assembly of claim 16, wherein the insulation layer comprises anodized aluminum and a polytetrafluoroethylene (PTFE) coating.

20. The coaxial socket assembly of claim 19, wherein the anodized aluminum in the insulation layer has a thickness greater than approximately 0.02 mm.

21. The coaxial socket assembly of claim 19, wherein the polytetrafluoroethylene (PTFE) coating in the insulation layer has a thickness greater than about 0.001 mm.

22. A coaxial socket for use in a test system, the test system configured to align at least a portion of an electronic device with a plurality of aligned connectors, the coaxial socket comprising:
   a conductive structure having a plurality of openings, the plurality of openings spaced to accommodate the plurality of aligned connectors, at least one opening in the plurality of openings extending through a thickness of the conductive structure, the at least one opening having an annular inner surface, the annular inner surface being proximal to at least a portion of a conductive outer surface of at least one aligned connector of the plurality of aligned connectors in the test system; and
   a socket retainer comprising:
   a metal retainer including a plurality of annular guide holes extending through the metal retainer and configured to accommodate the plurality of aligned connectors when the socket retainer is aligned with the conductive structure, at least one of the annular guide holes of the plurality of annular guide holes having an annular retainer surface; and
   a retainer insulation layer provided on the annular retainer surface, the retainer insulation layer configured to align with the annular inner surface when the socket retainer is aligned with the conductive structure, the socket retainer and the conductive structure configured to present a cavity interface to the at least one aligned connector;
   wherein the socket retainer and the conductive structure are configured to present a substantially constant impedance across the cavity interface to an electrical signal provided across the at least one aligned connector.

23. The coaxial socket of claim 22, wherein the at least one aligned connector is a spring probe.

24. The coaxial socket of claim 22, wherein the metal retainer comprises aluminum alloy material.

25. The coaxial socket of claim 22, wherein the metal retainer comprises at least one of a set of materials including: Mg, Ti, Zr, Cu, and Fe.

26. The coaxial socket of claim 22, wherein the conductive structure comprises a copper alloy.

27. The coaxial socket of claim 22, wherein the electrical signal is at a frequency greater than about 20 GHz.

28. The coaxial socket of claim 22, wherein the electrical signal is at a frequency greater than about 25 GHz.

29. The coaxial socket of claim 22, wherein the electrical signal is at a frequency greater than about 30 GHz.

30. The coaxial socket of claim 22, wherein the retainer insulation layer comprises anodized aluminum and a polytetrafluoroethylene (PTFE) coating.

31. The coaxial socket of claim 30, wherein the anodized aluminum has a thickness greater than approximately 0.02 mm.

32. The coaxial socket of claim 30, wherein the polytetrafluoroethylene (PTFE) coating has a thickness greater than about 0.001 mm.

\* \* \* \* \*

UNITED STATES PATENT AND TRADEMARK OFFICE
CERTIFICATE OF CORRECTION

PATENT NO. : 8,808,010 B2  
APPLICATION NO. : 13/488025  
DATED : August 19, 2014  
INVENTOR(S) : Jiachun Zhou et al.

Page 1 of 1

It is certified that error appears in the above-identified patent and that said Letters Patent is hereby corrected as shown below:

On the Title Page, item (75), line 2,
"Dexian Liu, Jiangsu (CN);" should read --Dexian Liu, Suzhou (CN);--.

On the Title Page, item (75), line 4,
"Bizhao Li, Jiangsu (CN)" should read --Bizhao Li, Suzhou (CN)--.

In the Claims

In claim 15, column 14, line 9, "0,001 mm." should read --0.001 mm.--.

In claim 17, column 14, line 13, "aluminum, alloy material." should read --aluminum alloy material.--.

Signed and Sealed this
Twenty-fifth Day of November, 2014

Michelle K. Lee
*Deputy Director of the United States Patent and Trademark Office*